United States Patent
Hung et al.

(10) Patent No.: US 9,741,708 B2
(45) Date of Patent: Aug. 22, 2017

(54) TRANSIENT VOLTAGE SUPPRESSOR AND ESD PROTECTION DEVICE AND ARRAY THEREOF

(71) Applicant: UBIQ Semiconductor Corp., Hsinchu County (TW)

(72) Inventors: Kei-Kang Hung, Hsinchu County (TW); Chau-Chun Wen, Hsinchu County (TW)

(73) Assignee: UBIQ Semiconductor Corp., Hsinchu County (TW)

( * ) Notice: Subject to any disclaimer, the term of this patent is extended or adjusted under 35 U.S.C. 154(b) by 0 days.

(21) Appl. No.: 14/751,098

(22) Filed: Jun. 25, 2015

(65) Prior Publication Data
US 2016/0181236 A1  Jun. 23, 2016

(30) Foreign Application Priority Data
Dec. 19, 2014  (TW) .............................. 103144513 A

(51) Int. Cl.
| H01L 27/02 | (2006.01) |
| H01L 29/861 | (2006.01) |
| H01L 29/06 | (2006.01) |
| H01L 29/16 | (2006.01) |
| H01L 29/20 | (2006.01) |

(52) U.S. Cl.
CPC ...... *H01L 27/0255* (2013.01); *H01L 29/8611* (2013.01); *H01L 29/0642* (2013.01); *H01L 29/1608* (2013.01); *H01L 29/20* (2013.01)

(58) Field of Classification Search
CPC .................................................. H01L 27/0255
See application file for complete search history.

(56) References Cited

U.S. PATENT DOCUMENTS

| 5,744,854 | A  * | 4/1998 | Okada ................. H01L 27/0259 257/173 |
| 7,675,141 | B2 * | 3/2010 | Otake ................. H01L 29/0619 257/565 |
| 8,093,623 | B2 * | 1/2012 | Mawatari ............ H01L 27/0259 257/173 |
| 8,350,355 | B2 * | 1/2013 | Esmark ................... H01L 23/60 257/520 |
| 8,431,999 | B2 * | 4/2013 | Shen ................... H01L 27/0255 257/357 |
| 8,552,530 | B2   | 10/2013 | Lin et al. |
| 2014/0159206 | A1 * | 6/2014 | Hsu ....................... H01L 29/735 257/565 |
| 2014/0319598 | A1 * | 10/2014 | Bobde ................. H01L 27/0629 257/328 |

FOREIGN PATENT DOCUMENTS

TW  201351613  12/2013

* cited by examiner

*Primary Examiner* — Eugene Lee
(74) *Attorney, Agent, or Firm* — Jianq Chyun IP Office

(57) ABSTRACT

Provided is a transient voltage suppressor including a substrate, a well region of a first conductivity type, a first doped region of a second conductivity type, and a second doped region of the second conductivity type. The substrate is electrically floating. The well region is located in the substrate. The first doped region is located in the well region to form a diode, and the first doped region is electrically connected to a first voltage. The second doped region is located in the well region, and the second doped region is electrically connected to a second voltage.

16 Claims, 5 Drawing Sheets

TRANSIENT VOLTAGE SUPPRESSOR AND ESD PROTECTION DEVICE AND ARRAY THEREOF

CROSS-REFERENCE TO RELATED APPLICATION

This application claims the priority benefit of Taiwan application serial no. 103144513, filed on Dec. 19, 2014. The entirety of the above-mentioned patent application is hereby incorporated by reference herein and made a part of this specification.

BACKGROUND OF THE INVENTION

Field of the Invention

The invention relates to a transient voltage suppressor having high response speed, and an ESD protection device and an array thereof.

Description of Related Art

With the current rapid development of science and technology, the integrated circuit is widely applied in electronic apparatuses. In general, an electronic product is very susceptible to the sudden and uncontrollable electrostatic discharge (ESD), which causes the system of the electronic product to restart, and even causes the issue of irreversible damage to the hardware. Currently, a transient voltage suppressor (TVS) is a more effective solution to the issue of ESD of an electronic product. The transient voltage suppressor allows the energy of the ESD to be rapidly released via the transient voltage suppressor, thereby preventing damage to the electronic product from ESD. Therefore, the needs and the dependence of today's electronic products for the transient voltage suppressor are increased. The transient voltage suppressor is typically applied in, for instance, a universal serial bus (USB) power supply, data line protection, a digital video interface, high-speed Ethernet, a notebook computer, a display apparatus, and a flat-panel display.

For a high-speed interface applications (such as a high-definition multimedia interface (HDMI 2.0), a display port, and USB 3.x), to increase the reaction speed of the transient voltage suppressor, a smaller design for the size and the breakdown voltage thereof are preferred. However, to have better electrostatic discharge efficiency, a transient voltage suppressor of a larger size is designed. In other words, the response speed and the electrostatic discharge efficiency are in a trade-off relationship.

SUMMARY OF THE INVENTION

The invention provides a transient voltage suppressor and an ESD protection device thereof having higher response speed, thus facilitating signal transmission.

The invention provides a transient voltage suppressor including a substrate, a well region of a first conductivity type, a first doped region of a second conductivity type, and a second doped region of the second conductivity type. The substrate is electrically floating. The well region is located in the substrate. The first doped region is located in the well region, and the first doped region is electrically connected to a first voltage. The second doped region is located in the well region, and the second doped region is electrically connected to a second voltage.

In an embodiment of the invention, a gate structure is not disposed on the well region between the first doped region and the second doped region.

An embodiment of the invention further includes two isolation structures located in the substrate. The first doped region and the second doped region are located between two isolation structures and are not in contact with the two isolation structures.

In an embodiment of the invention, except in the well region outside the first doped region and outside the second doped region, the doping concentration of the first conductivity type at the same depth is the same.

In an embodiment of the invention, the doping concentration of the substrate along a first direction is a waveform plot. The waveform plot includes: a plurality of peaks and a plurality of troughs. The peaks are respectively located between one of the two isolation structures and the first doped region, between the first doped region and the second doped region, and between the second doped region and the other of the two isolation structures. The troughs are respectively located in the first doped region and the second doped region. Each trough is located between two adjacent peaks. The peaks and the troughs are alternately disposed along the first direction.

In an embodiment of the invention, except in the well region outside the first doped region and outside the second doped region, an another doped region of the second conductivity type is not disposed in the well region.

In an embodiment of the invention, when the first conductivity type is P type, the second conductivity type is N type; when the first conductivity type is N type, the second conductivity type is P type.

The invention provides an ESD protection device including: a transient voltage suppressor and at least one diode series structure. The transient voltage suppressor including a substrate, a well region of a first conductivity type, a first doped region of a second conductivity type, and a second doped region of the second conductivity type. The substrate is electrically floating. The well region is located in the substrate. The first doped region is located in the well region, and the first doped region is electrically connected to a first voltage. The second doped region is located in the well region, and the second doped region is electrically connected to a second voltage. The at least one diode series structure is parallel to the transient voltage suppressor.

In an embodiment of the invention, the at least one diode series structure includes: a first diode and a second diode. The first diode is located at one side of the transient voltage suppressor. The first diode includes: a first well region of the first conductivity type, a third doped region of the second conductivity type, and a fourth doped region of the first conductivity type. The first well region is located in the substrate. The third doped region is located in the first well region. The fourth doped region is located in the first well region. The fourth doped region is electrically connected to the second doped region. The second diode is located between the first diode and the transient voltage suppressor. The second diode includes: a second well region of the second conductivity type, a fifth doped region of the second conductivity type, and a sixth doped region of the first conductivity type. The second well region is located in the substrate. The fifth doped region is located in the second well region. The sixth doped region is located in the second well region. The fifth doped region is electrically connected to the first doped region.

In an embodiment of the invention, the third doped region and the sixth doped region are electrically connected to an input/output terminal (I/O). The fifth doped region and the first doped region are electrically connected to the first voltage. The fourth doped region and the second doped region are electrically connected to the second voltage. The first voltage is greater than the second voltage.

In an embodiment of the invention, the second voltage is a ground voltage.

In an embodiment of the invention, the at least one diode series structure includes: a third diode and a fourth diode. The third diode is located between the first diode and the second diode. The third diode includes: a third well region of the first conductivity type, a seventh doped region of the second conductivity type, and an eighth doped region of the first conductivity type. The third well region is located in the substrate. The seventh doped region is located in the third well region. The eighth doped region is located in the third well region. The eighth doped region is electrically connected to the third doped region. The fourth diode is located between the third diode and the second diode. The fourth diode includes: a fourth well region of the second conductivity type, a ninth doped region of the second conductivity type, and a tenth doped region of the first conductivity type. The fourth well region is located in the substrate. The ninth doped region is located in the fourth well region. The tenth doped region is located in the fourth well region. The ninth doped region is electrically connected to the sixth doped region.

In an embodiment of the invention, the seventh doped region and the tenth doped region are electrically connected to an input/output terminal (I/O). The fifth doped region and the first doped region are electrically connected to the first voltage. The fourth doped region and the second doped region are electrically connected to the second voltage. The first voltage is greater than the second voltage.

In an embodiment of the invention, the second voltage is a ground voltage.

An embodiment of the invention further includes a lightly-doped well region located between the substrate and the well region. The conductivity type of each of the lightly-doped well region and the substrate is different.

The invention provides a transient voltage suppressor array, including: a transient voltage suppressor and at least two diode series structures. The transient voltage suppressor including a substrate, a well region of a first conductivity type, a first doped region of a second conductivity type, and a second doped region of the second conductivity type. The substrate is electrically floating. The well region is located in the substrate. The first doped region is located in the well region, and the first doped region is electrically connected to a first voltage. The second doped region is located in the well region, and the second doped region is electrically connected to a second voltage. The at least two diode series structures are parallel to the transient voltage suppressor. One of the at least two diode series structures is electrically connected to a first input/output terminal (I/O1). The other of the at least two diode series structures is electrically connected to a second input/output terminal (I/O2).

Based on the above, the transient voltage suppressor of the invention has a first doped region and a second doped region of the same conductivity type. Since the first doped region is electrically connected to a first voltage, and the second doped region is electrically connected to a second voltage, in comparison the transient voltage suppressor of the prior art having three pins, the area of the transient voltage suppressor of the invention is smaller, and therefore the response speed of the device can be increased. Moreover, since the substrate of the transient voltage suppressor of the invention is electrically floating, the electrostatic discharge current is transmitted along a transverse path, and is not transmitted along a vertical path. In this way, the breakdown voltage (BVceo) of the transient voltage suppressor of the invention can be reduced to further increase the response speed of the device.

Several exemplary embodiments accompanied with figures are described in detail below to further describe the disclosure in details.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

In the following embodiments, when the first conductivity type is P type, the second conductivity type is N type; when the first conductivity type is N type, the second conductivity type is P type. The P type dopant is, for instance, boron or boron difluoride. The N type dopant is, for instance, phosphorous or arsenic. In the present embodiment, the first conductivity type can be P type, and the second conductivity type can be N type. However, the invention is not limited thereto, and the opposite can also be implemented.

Figure 1:
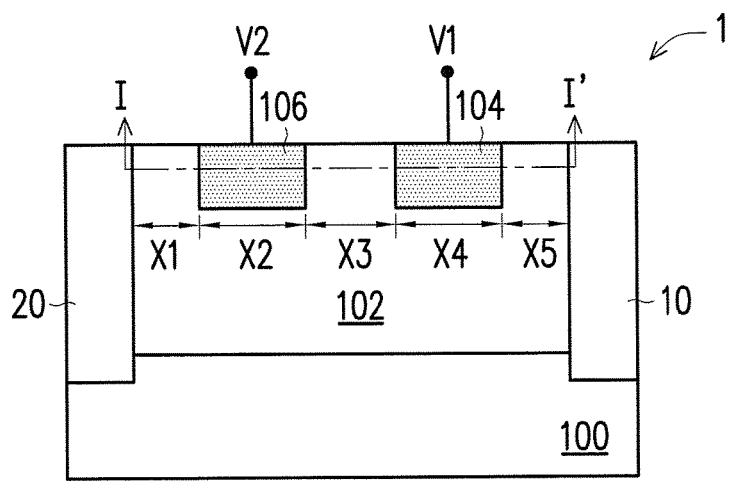
FIG. 1 is a cross-sectional schematic of a transient voltage suppressor of an embodiment of the invention.
Figure 2:
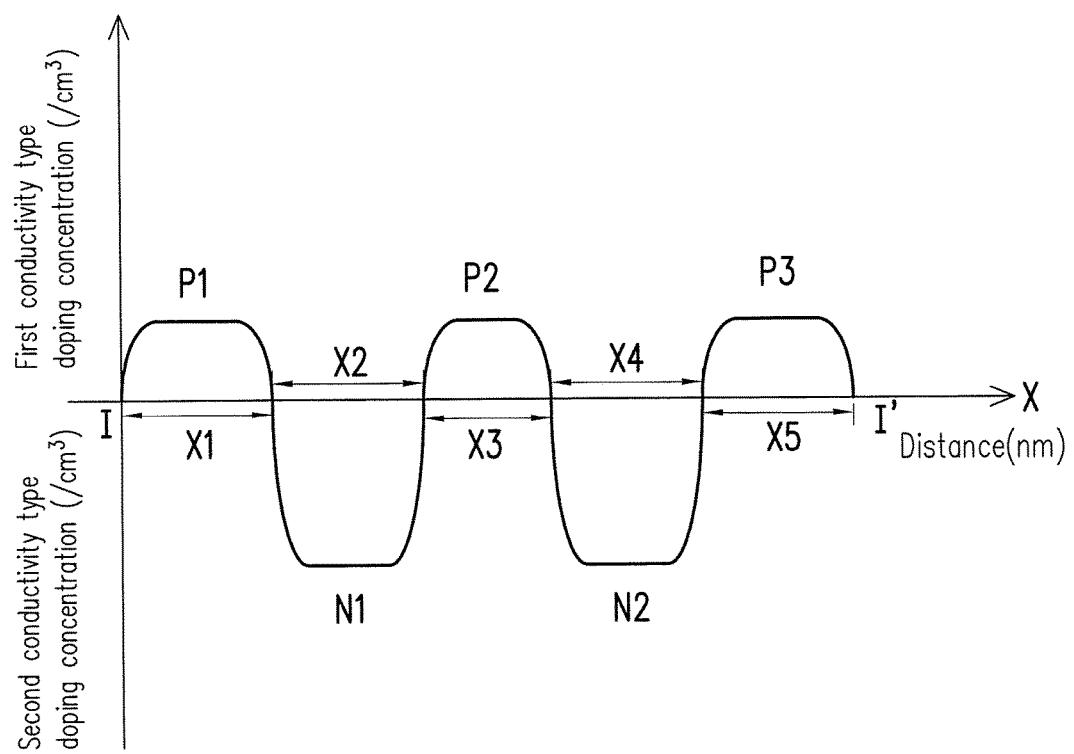
FIG. 2 is a graph of doping concentrations of first conductivity type and second conductivity type along line I-I' in FIG. 1.

FIG. 1 is a cross-sectional schematic of a transient voltage suppressor of an embodiment of the invention. FIG. 2 is a graph of doping concentrations of first conductivity type and second conductivity type along line I-I' in FIG. 1.

Referring to FIG. 1, the invention provides a transient voltage suppressor 1, including: a substrate 100, a well region 102 of a first conductivity type, a first doped region 104 of a second conductivity type, a second doped region 106 of the second conductivity type, and two isolation structures 10 and 20. The substrate 100 is electrically floating. The substrate 100 is, for instance, a semiconductor substrate, a semiconductor compound substrate, or a silicon on insulator (SOI). The semiconductor is, for instance, a Group IVA atom such as silicon or germanium. The semiconductor compound is, for instance, a semiconductor compound formed by a Group IVA atom, such as silicon carbide or silicon germanium, or a semiconductor compound formed by a Group IIIA atom and a Group VA atom, such as gallium arsenide. In the present embodiment, the substrate 100 can have an N type dopant. But the invention is not limited thereto, and in other embodiments, the substrate 100 can also have a P type dopant.

The well region 102 is of the first conductivity type and is located in the substrate 100. The dopant of the well region 102 is, for instance, boron or boron difluoride, and the doping concentration thereof can be, for instance, $1\times10^{15}/cm^3$ to $1\times10^{17}/cm^3$. The first doped region 104 and the second doped region 106 are both located in the well region 102. The dopant of each of the first doped region 104 and the second doped region 106 is, for instance, phosphorus or arsenic, the doping concentration of the first doped region 104 can be, for instance, $1\times10^{20}/cm^3$ to $1\times10^{22}/cm^3$; and the doping concentration of the second doped region 106 can be, for instance, $1\times10^{20}/cm^3$ to $1\times10^{22}/cm^3$. The first doped region 104 is electrically connected to a first voltage V1. The second doped region 106 is electrically connected to a second voltage V2. In the present embodiment, the first doped region 104 and the well region 102 are of different conductivity types and can form a diode. The second doped region 106 and the well region 102 are also of different conductivity types and can form another diode.

The isolation structure 10 and the isolation structure 20 are both located in the substrate 100. The first doped region 104 and the second doped region 106 are located between the isolation structure 10 and the isolation structure 20 and are not in contact with the isolation structure 10 and the isolation structure 20. The isolation structure 10 and the isolation structure 20 can be, for instance, LOCal oxidation of silicon (LOCOS) or shallow trench isolation (STI). The material of each of the isolation structure 10 and the isolation structure 20 can be, for instance, silicon oxide, silicon nitride, or a combination thereof.

Referring to both FIG. 1 and FIG. 2, the doping concentrations of the first conductivity type and the second conductivity type of the substrate 100 along line I-I' can be, for instance, waveform plots. In the present embodiment, line I-I' can be regarded as a first direction. The waveform plots include: peaks P1 to P3 and troughs N1 to N2. The trough N1 is located between the peak P1 and the peak P2; and the trough N2 is located between the peak P2 and the peak P3. The peaks P1 to P3 and the troughs N1 to N2 can be alternately disposed along the direction of line I-I'. In the present embodiment, a distance X2 represents the width of the doped region 106, and the waveform plot of the trough N1 region represents the doping concentration of the doped region 106 of the second conductivity type; a distance X4 represents the width of the doped region 104, and the waveform plot of the trough N2 region represents the doping concentration of the doped region 104 of the second conductivity type.

Similarly, a distance X1 represents the distance between the second doped region 106 and the isolation structure 20, and the waveform plot of the peak P1 region represents the doping concentration of the well region 102 of the first conductivity type between the second doped region 106 and the isolation structure 20. A distance X3 represents the distance between the first doped region 104 and the second doped region 106, the waveform plot of the peak P2 region represents the doping concentration of the well region 102 of the first conductivity type between the first doped region 104 and the second doped region 106; and a distance X5 represents the distance between the first doped region 104 and the isolation structure 10, the waveform plot of the peak P3 region represents the doping concentration of the well region 102 of the first conductivity type between the first doped region 104 and the isolation structure 10.

Since except in the well region 102 outside the first doped region 104 and outside the second doped region 106, an another doped region of the second conductivity type is not disposed in the well region 102, the doping concentration of the first conductivity type having the same depth in the well region 102 is the same. Moreover, a gate structure is not disposed on the well region 102 between the first doped region 104 and the second doped region 106.

The transient voltage suppressor of the invention has a first doped region and a second doped region of the same conductivity type. Since the first doped region is electrically connected to the first voltage, and the second doped region is electrically connected to the second voltage, in comparison the transient voltage suppressor of the prior art having three pins, the area of the transient voltage suppressor of the invention is smaller, and therefore the response speed of the device can be increased. Moreover, since the substrate of the transient voltage suppressor of the invention is electrically floating, the electrostatic discharge current is transmitted along a transverse path, and is not transmitted along a vertical path. In this way, the breakdown voltage (BVceo) of the transient voltage suppressor can be reduced, and therefore the response speed of the device is increased.

Figure 3:
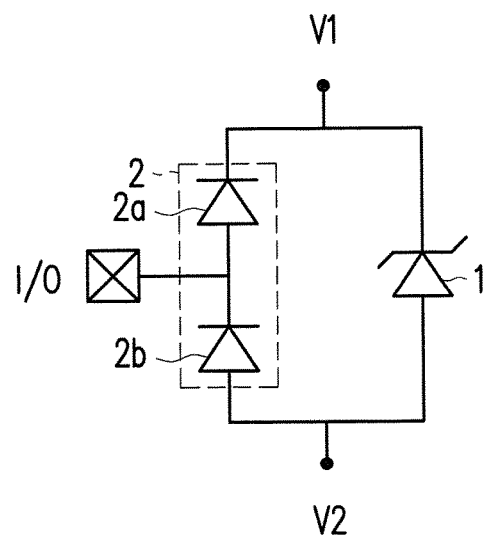
FIG. 3 is a circuit schematic of an ESD protection device of the first and second embodiments of the invention.
Figure 4:
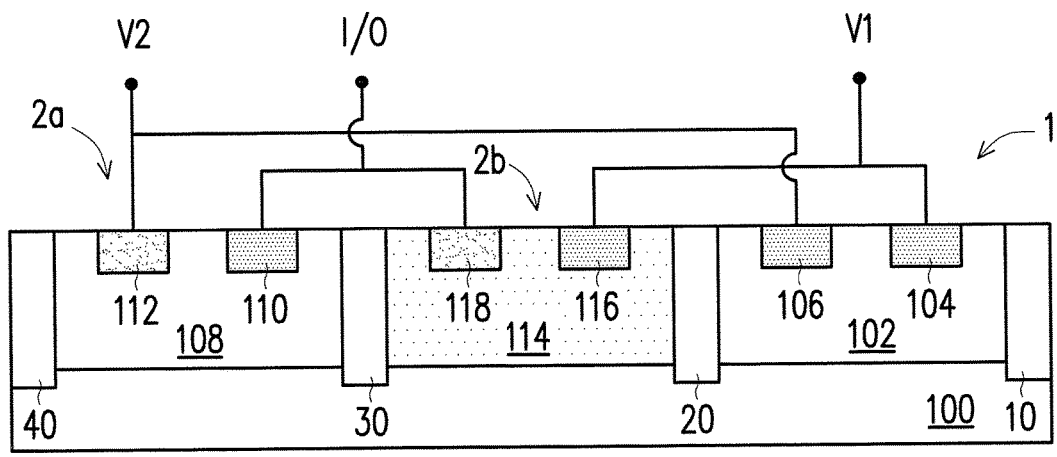
FIG. 4 is a cross-sectional schematic of an ESD protection device of the first embodiment of the invention.
Figure 5:
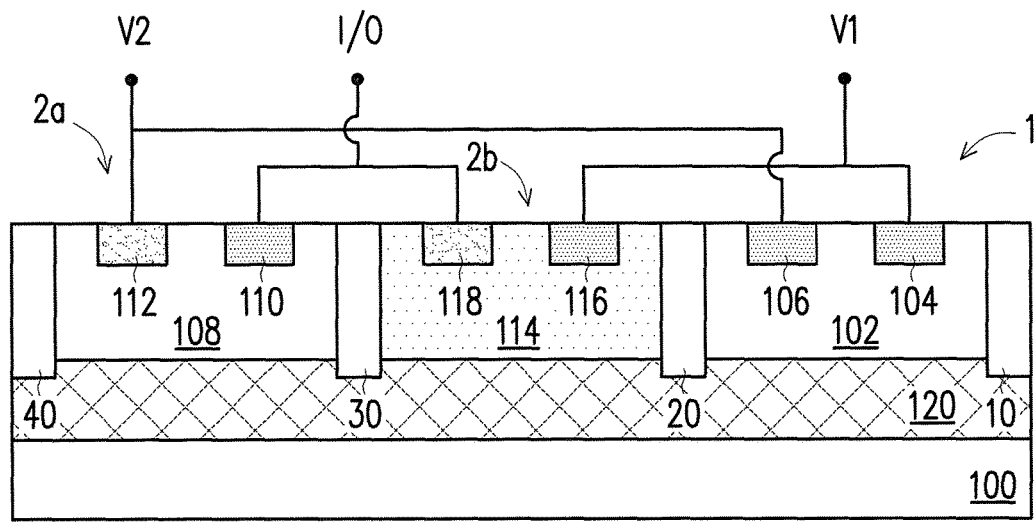
FIG. 5 is a cross-sectional schematic of an ESD protection device of the second embodiment of the invention.

FIG. 3 is a circuit schematic of an ESD protection device of the first and second embodiments of the invention. FIG. 4 is a cross-sectional schematic of an ESD protection device of the first embodiment of the invention. FIG. 5 is a cross-sectional schematic of an ESD protection device of the second embodiment of the invention.

Referring to FIG. 3, the invention provides an ESD protection device including a transient voltage suppressor 1 and a diode series structure 2. The transient voltage suppressor 1 is parallel to the diode series structure 2. The transient voltage suppressor 1 and a terminal of the diode series structure 2 are electrically connected to a first voltage V1. The transient voltage suppressor 1 and another terminal of the diode series structure 2 are electrically connected to a second voltage V2. The diode series structure 2 includes a first diode 2a and a second diode 2b. The first diode 2a and the second diode 2b are electrically connected to an input/output terminal I/O. The first voltage V1 is greater than the second voltage V2. In an embodiment, the second voltage V2 is a ground voltage. For instance, when positive electrostatic occurs at the input/output terminal (I/O), the input/output terminal receives a positive electrostatic voltage, such that the positive voltage of the first diode 2a is greater than the negative voltage, and the first diode 2a conducts in a state of forward bias. Accordingly, the electrostatic discharge current can pass through the first diode 2a, and then pass through the transient voltage suppressor 1. After the transient voltage suppressor 1 breaks down, the electrostatic discharge current can be guided to a ground terminal. Since the substrate of the transient voltage suppressor of the invention is electrically floating, the electrostatic discharge current is transmitted along a transverse path, and is not transmitted along a vertical path. In this way, the breakdown voltage (BVceo) of the transient voltage suppressor can be reduced, and therefore the response speed of the device is increased.

Specifically, referring to FIG. 4, an ESD protection device of the invention includes a transient voltage suppressor 1 and a diode series structure 2. The transient voltage suppressor 1 (as shown in FIG. 1) is as described above and is therefore not repeated herein. The diode series structure 2 includes a first diode 2a and a second diode 2b. The second diode 2b is located between the first diode 2a and the transient voltage suppressor 1.

The first diode 2a includes: a first well region 108 of the first conductivity type, a third doped region 110 of the second conductivity type, and a fourth doped region 112 of the first conductivity type. The first well region 108 is located in the substrate 100. The dopant of the first well region 108 is, for instance, boron or boron difluoride, and the doping concentration thereof can be, for instance, $1 \times 10^{15}/cm^3$ to $1 \times 10^{17}/cm^3$. The third doped region 110 and the fourth doped region 112 are both located in the first well region 108. The dopant of the third doped region 110 is, for instance, phosphorous or arsenic, and the doping concentration of the third doped region 110 can be, for instance, $1 \times 10^{20}/cm^3$ to $1 \times 10^{22}/cm^3$. The dopant of the fourth doped region 112 is, for instance, boron or boron difluoride, and the doping concentration of the fourth doped region 112 can be, for instance, $1 \times 10^{20}/cm^3$ to $1 \times 10^{22}/cm^3$.

The second diode 2b includes: a second well region 114 of the second conductivity type, a fifth doped region 116 of the second conductivity type, and a sixth doped region 118 of the first conductivity type. The second well region 114 is located in the substrate 100. The dopant of the second well region 114 is, for instance, phosphorous or arsenic, and the doping concentration of the second well region 114 can be, for instance, $1 \times 10^{15}/cm^3$ to $1 \times 10^{17}/cm^3$. The fifth doped region 116 and the sixth doped region 118 are both located in the second well region 114. The dopant of the fifth doped region 116 is, for instance, phosphorous or arsenic, and the doping concentration of the fifth doped region 116 can be, for instance, $1 \times 10^{20}/cm^3$ to $1 \times 10^{22}/cm^3$. The dopant of the sixth doped region 118 is, for instance, boron or boron difluoride, and the doping concentration of the sixth doped region 118 can be, for instance, $1 \times 10^{20}/cm^3$ to $1 \times 10^{22}/cm^3$.

The first doped region 104 of the transient voltage suppressor 1 and the fifth doped region 116 of the second diode 2b are electrically connected to a first voltage V1. The second doped region 106 of the transient voltage suppressor 1 and the fourth doped region 112 of the first diode 2a are electrically connected to a second voltage V2. The first voltage V1 is greater than the second voltage V2. In the present embodiment, the second voltage V2 is a ground voltage. The third doped region 110 of the first diode 2a and the sixth doped region 118 of the second diode 2b are electrically connected to the input/output terminal I/O.

Moreover, the ESD protection device of FIG. 4 can further include isolation structures 10, 20, 30, and 40 located in the substrate 100. The isolation structures 10 and 20 are located at two sides of the transient voltage suppressor 1. The isolation structures 30 and 40 are located at two sides of the first diode 2a, and the isolation structure 30 is located between the first diode 2a and the second diode 2b. The isolation structures 10, 20, 30, and 40 can prevent leakage current between the transient voltage suppressor 1, the first diode 2a, and the second diode 2b. In this way, the ESD protection device of the invention can have lower input capacitance, thus facilitating signal quality, such that the ESD protection device of the invention is more suitable for an electronic device applied in high-speed interface.

Referring to FIG. 5, the ESD protection device of FIG. 5 is similar to the ESD protection device of FIG. 4, and the difference thereof is: the ESD protection device of FIG. 5 further includes a lightly-doped well region 120 located between the substrate 100 and the well region 102, between the substrate 100 and the first well region 108, and between the substrate 100 and the second well region 114. The dopant of the lightly-doped well region 120 is, for instance, phosphorous or arsenic, and the doping concentration of the lightly-doped well region 120 can be, for instance, $1 \times 10^{15}/cm^3$ to $1 \times 10^{17}/cm^3$. In the present embodiment, the conductivity type of each of the lightly-doped well region 120 and the substrate 100 is different. For instance, when the substrate 100 has a P type dopant, the lightly-doped well region 120 has an N type dopant.

Figure 6:
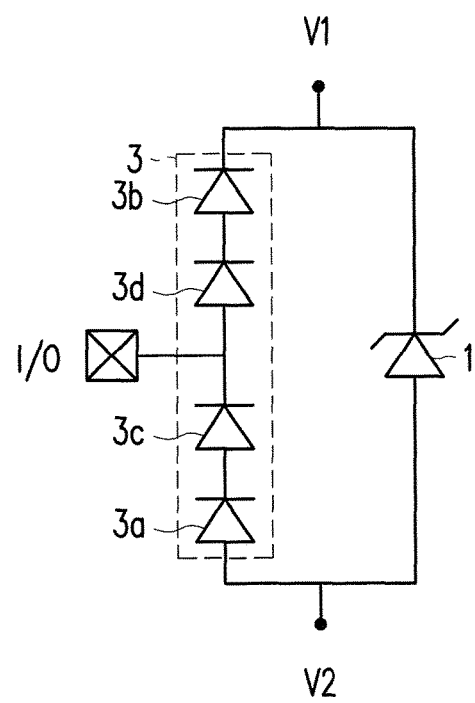
FIG. 6 is a circuit schematic of an ESD protection device of the third and fourth embodiments of the invention.
Figure 7:
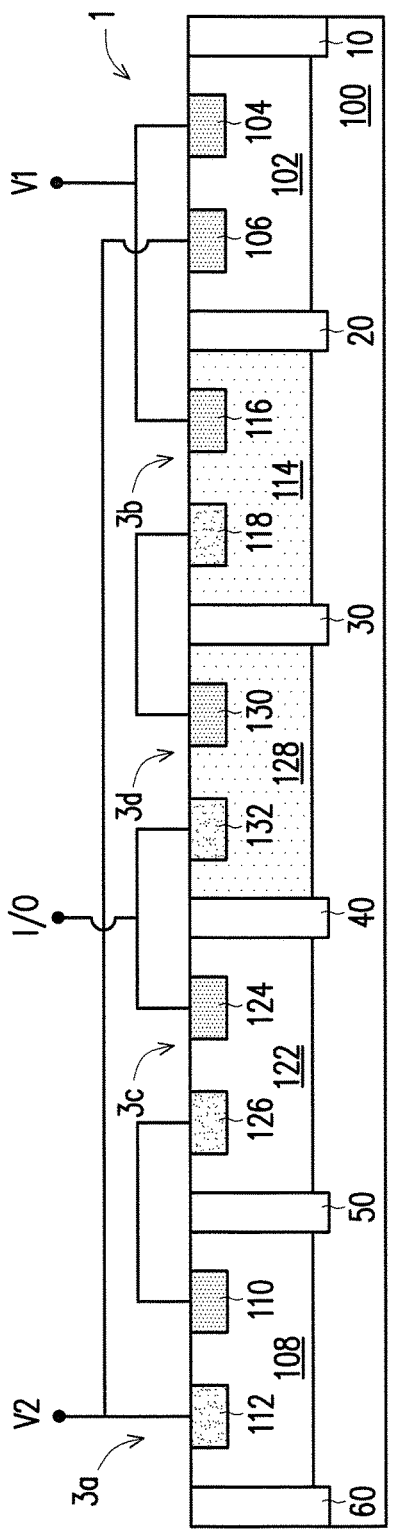
FIG. 7 is a cross-sectional schematic of an ESD protection device of the third embodiment of the invention.
Figure 8:
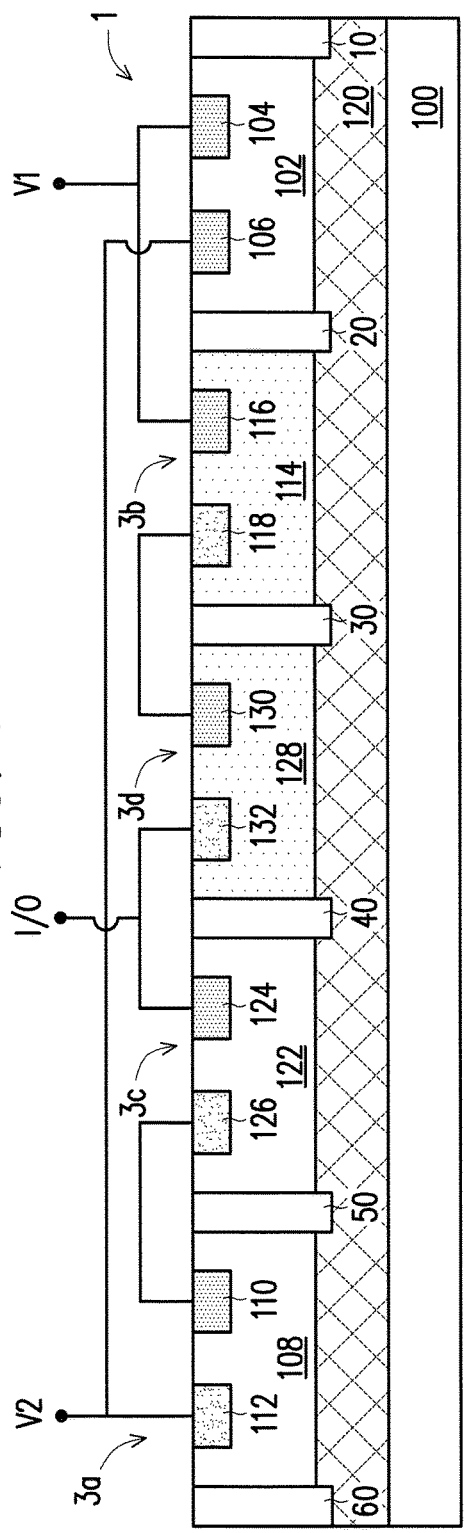
FIG. 8 is a cross-sectional schematic of an ESD protection device of the fourth embodiment of the invention.

FIG. 6 is a circuit schematic of an ESD protection device of the third and fourth embodiments of the invention. FIG. 7 is a cross-sectional schematic of an ESD protection device of the third embodiment of the invention. FIG. 8 is a cross-sectional schematic of an ESD protection device of the fourth embodiment of the invention.

Referring to FIG. 6, the invention provides another ESD protection device including a transient voltage suppressor 1 and a diode series structure 3. The transient voltage suppressor 1 is parallel to the diode series structure 3. The diode series structure 3 includes: a first diode 3a, a second diode 3b, a third diode 3c, and a fourth diode 3d. The transient voltage suppressor 1 and a terminal of the diode series structure 3 are electrically connected to a first voltage V1. The transient voltage suppressor 1 and another terminal of the diode series structure 3 are electrically connected to a second voltage V2. The third diode 3c and the fourth diode 3d are electrically connected to the input/output terminal I/O.

Specifically, referring to FIG. 7, an ESD protection device of the invention includes a transient voltage suppressor 1 and a diode series structure 3. The transient voltage suppressor 1 (as shown in FIG. 1) is as described above and is therefore not repeated herein. The diode series structure 3 includes: a first diode 3a, a second diode 3b, a third diode 3c, and a fourth diode 3d. The structures of the first diode 3a and the second diode 3b are similar to the structures of the first diode 2a and the second diode 2b, which are described above and are therefore not repeated herein. The third diode 3c and the fourth diode 3d are both located between the first diode 3a and the second diode 3b, and the fourth diode 3d is located between the third diode 3c and the second diode 3b.

The third diode 3c includes: a third well region 122 of the first conductivity type, a seventh doped region 124 of the second conductivity type, and an eighth doped region 126 of the first conductivity type. The dopant of the third well region 122 is, for instance, boron or boron difluoride, and the doping concentration thereof can be, for instance, $1 \times 10^{15}/cm^3$ to $1 \times 10^{17}/cm^3$. The seventh doped region 124 and the eighth doped region 126 are both located in the third well region 122. The dopant of the seventh doped region 124 is, for instance, phosphorous or arsenic, and the doping concentration of the seventh doped region 124 can be, for instance, $1 \times 10^{20}/cm^3$ to $1 \times 10^{22}/cm^3$. The dopant of the eighth doped region 126 is, for instance, boron or boron difluoride, and the doping concentration of the eighth doped region 126 can be, for instance, $1 \times 10^{20}/cm^3$ to $1 \times 10^{22}/cm^3$.

The fourth diode 3d includes: a fourth well region 128 of the second conductivity type, a ninth doped region 130 of the second conductivity type, and a tenth doped region 132 of the first conductivity type. The fourth well region 128 is located in the substrate 100. The dopant of the fourth well region 128 is, for instance, phosphorous or arsenic, and the doping concentration of the fourth well region 128 can be, for instance, $1 \times 10^{15}/cm^3$ to $1 \times 10^{17}/cm^3$. The ninth doped region 130 and the tenth doped region 132 are both located in the fourth well region 128. The dopant of the ninth doped region 130 is, for instance, phosphorous or arsenic, and the doping concentration of the ninth doped region 130 can be, for instance, $1 \times 10^{20}/cm^3$ to $1 \times 10^{22}/cm^3$. The dopant of the tenth doped region 132 is, for instance, boron or boron difluoride, and the doping concentration of the tenth doped region 132 can be, for instance, $1\times10^{20}/cm^3$ to $1\times10^{22}/cm^3$.

The first doped region 104 of the transient voltage suppressor 1 and the fifth doped region 116 of the second diode 3b are electrically connected to a first voltage V1. The second doped region 106 of the transient voltage suppressor 1 and the fourth doped region 112 of the first diode 3a are electrically connected to a second voltage V2. The first voltage V1 is greater than the second voltage V2. In the present embodiment, the second voltage V2 is a ground voltage. The sixth doped region 118 of the second diode 3b is electrically connected to the ninth doped region 130 of the fourth diode 3d. The tenth doped region 132 of the fourth diode 3d and the seventh doped region 124 of the third diode 3c are electrically connected to the input/output terminal I/O. The eighth doped region 126 of the third diode 3c is electrically connected to the third doped region 110 of the first diode 3a.

Moreover, the ESD protection device of FIG. 7 further includes an isolation structure 10 to an isolation structure 60 located in the substrate 100. The isolation structures 10 and 60 are respectively located at two sides of the ESD protection device. The isolation structure 20 to the isolation structure 50 are respectively located between the transient voltage suppressor 1 and the second diode 3b, between the second diode 3b and the fourth diode 3d, between the fourth diode 3d and the third diode 3c, and between the third diode 3c and the first diode 3a. The isolation structure 10 to the isolation structure 60 can prevent the occurrence of leakage current between the transient voltage suppressor 1, the first diode 3a, the second diode 3b, the third diode 3c, and the fourth diode 3d. In this way, the ESD protection device of the invention can have lower input capacitance, thus facilitating signal quality, such that the ESD protection device of the invention is more suitable for an electronic device applied in high-speed interface.

Referring to FIG. 8, the ESD protection device of FIG. 8 is similar to the ESD protection device of FIG. 7, and the difference thereof is: the ESD protection device of FIG. 8 further includes a lightly-doped well region 120 located between the substrate 100 and the well region 102, the first well region 108, the second well region 114, the third well region 122, and the fourth well region 128. The dopant of the lightly-doped well region 120 is, for instance, phosphorous or arsenic, and the doping concentration of the lightly-doped well region 120 can be, for instance, $1\times10^{15}/cm^3$ to $1\times10^{17}/cm^3$. In the present embodiment, the conductivity type of each of the lightly-doped well region 120 and the conductivity type of the substrate 100 is different. For instance, when the lightly-doped well region 120 has an N type dopant, the substrate 100 has a P type dopant.

Figure 9:
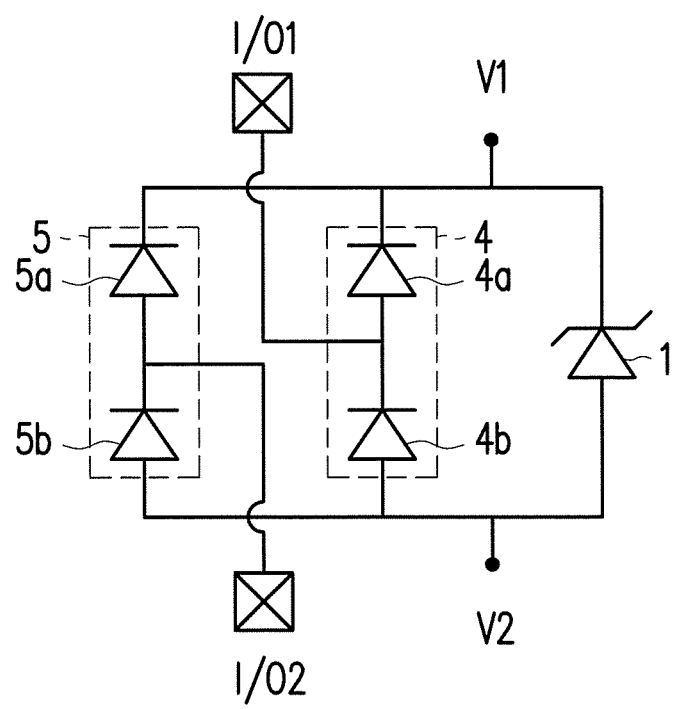
FIG. 9 is a circuit schematic of a transient voltage suppressor array of an embodiment of the invention.

FIG. 9 is a circuit schematic of a transient voltage suppressor array of an embodiment of the invention.

Referring to FIG. 9, the invention provides a transient voltage suppressor array, including: a transient voltage suppressor 1, a diode series structure 4, and a diode series structure 5. The diode series structure 4, the diode series structure 5, and the transient voltage suppressor 1 are parallel to one another. The transient voltage suppressor 1 and a terminal of the diode series structure 4 are electrically connected to a first voltage V1. The transient voltage suppressor 1 and another terminal of the diode series structure 4 are electrically connected to a second voltage V2. The diode series structure 4 includes a first diode 4a and a second diode 4b. The first diode 4a and the second diode 4b are electrically connected to a first input/output terminal I/O1. The diode series structure 5 includes a first diode 5a and a second diode 5b. The first diode 5a and the second diode 5b are electrically connected to a second input/output terminal I/O2. The transient voltage suppressor array of the present embodiment includes two input/output terminals and two diode series structures. However, the invention is not limited thereto, and in other embodiments, the transient voltage suppressor array can also include a plurality of input/output terminals and a plurality of diode series structures to conform to the design of the electronic device.

Based on the above, the transient voltage suppressor of the invention has a first doped region and a second doped region of the same conductivity type. Since the first doped region is electrically connected to a first voltage, and the second doped region is electrically connected to a second voltage, in comparison the transient voltage suppressor of the prior art having three pins, the area of the transient voltage suppressor of the invention is smaller, and therefore the response speed of the device can be increased. Moreover, since the substrate of the transient voltage suppressor of the invention is electrically floating, the electrostatic discharge current is transmitted along a transverse path, and is not transmitted along a vertical path. In this way, the breakdown voltage of the transient voltage suppressor of the invention can be reduced to further increase the response speed of the device. Moreover, the isolation structures of the invention can electrically isolate the transient voltage suppressor and the well region of each of the diodes, such that the ESD protection device of the invention has lower input capacitance. As a result, signal quality is increased.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A transient voltage suppressor, comprising:
a Zener diode with bi-directional discharge, comprising:
a substrate, wherein the substrate is electrically floating;
a well region of a first conductivity type located in the substrate;
a first doped region of a second conductivity type located in the well region, wherein the first doped region is electrically connected to a first voltage; and
a second doped region of the second conductivity type located in the well region, wherein the second doped region is electrically connected to a second voltage.

2. The transient voltage suppressor of claim 1, wherein a gate structure is not disposed on the well region between the first doped region and the second doped region.

3. The transient voltage suppressor of claim 1, further comprising two isolation structures located in the substrate, wherein the first doped region and the second doped region are located between the two isolation structures and are not in contact with the two isolation structures.

4. The transient voltage suppressor of claim 3, wherein the well region has a doping concentration of the first conductivity type and the doping concentration at a same depth is the same.

5. The transient voltage suppressor of claim 3, wherein a doping concentration curve in the substrate is a waveform plot along a first direction, and the waveform plot comprises:
a plurality of peaks respectively located between one of the two isolation structures and the first doped region, between the first doped region and the second doped region, and between the second doped region and the other of the two isolation structures; and a plurality of troughs respectively located in the first doped region and the second doped region, wherein each trough is located between two adjacent peaks, and the peaks and the troughs are alternately disposed along the first direction.

6. The transient voltage suppressor of claim 1, wherein except in the well region outside the first doped region and outside the second doped region, an another doped region of the second conductivity type is not disposed in the well region.

7. The transient voltage suppressor of claim 1, wherein when the first conductivity type is P type, the second conductivity type is N type; when the first conductivity type is N type, the second conductivity type is P type.

8. An ESD protection device, comprising:
a transient voltage suppressor, comprising a Zener diode with bi-directional discharge, comprising:
  a substrate, wherein the substrate is electrically floating;
  a well region of a first conductivity type located in the substrate;
  a first doped region of a second conductivity type located in the well region, wherein the first doped region is electrically connected to a first voltage; and
  a second doped region of the second conductivity type located in the well region, wherein the second doped region is electrically connected to a second voltage; and
at least one diode series structure parallel to the transient voltage suppressor.

9. The ESD protection device of claim 8, wherein the at least one diode series structure comprises:
a first diode located at one side of the transient voltage suppressor, the first diode comprising:
  a first well region of the first conductivity type located in the substrate;
  a third doped region of the second conductivity type located in the first well region; and
  a fourth doped region of the first conductivity type located in the first well region, wherein the fourth doped region is electrically connected to the second doped region; and
a second diode located between the first diode and the transient voltage suppressor, wherein the second diode comprises:
  a second well region of the second conductivity type located in the substrate;
  a fifth doped region of the second conductivity type located in the second well region; and
  a sixth doped region of the first conductivity type located in the second well region, wherein the fifth doped region is electrically connected to the first doped region.

10. The ESD protection device of claim 9, wherein the third doped region and the sixth doped region are electrically connected to an input/output terminal;
the fifth doped region and the first doped region are electrically connected to the first voltage; and
the fourth doped region and the second doped region are electrically connected to the second voltage, wherein the first voltage is greater than the second voltage.

11. The ESD protection device of claim 10, wherein the second voltage is a ground voltage.

12. The ESD protection device of claim 9, wherein the at least one diode series structure comprises:
a third diode located between the first diode and the second diode, the third diode comprising:
  a third well region of the first conductivity type located in the substrate;
  a seventh doped region of the second conductivity type located in the third well region; and
  an eighth doped region of the first conductivity type located in the third well region, wherein the eighth doped region is electrically connected to the third doped region; and
a fourth diode located between the third diode and the second diode, wherein the fourth diode comprises:
  a fourth well region of the second conductivity type located in the substrate;
  a ninth doped region of the second conductivity type located in the fourth well region; and
  a tenth doped region of the first conductivity type located in the fourth well region, wherein the ninth doped region is electrically connected to the sixth doped region.

13. The ESD protection device of claim 12, wherein the seventh doped region and the tenth doped region are electrically connected to an input/output terminal;
the fifth doped region and the first doped region are electrically connected to the first voltage;
the fourth doped region and the second doped region are electrically connected to the second voltage, wherein the first voltage is greater than the second voltage.

14. The ESD protection device of claim 13, wherein the second voltage is a ground voltage.

15. The ESD protection device of claim 8, further comprising a lightly-doped well region located between the substrate and the well region, wherein a conductivity type of each of the lightly-doped well region and the substrate is different.

16. A transient voltage suppressor may, comprising:
a transient voltage suppressor, comprising a Zener diode with bi-directional discharge, comprising:
  a substrate, wherein the substrate is electrically floating;
  a well region of a first conductivity type located in the substrate;
  a first doped region of a second conductivity type located in the well region, wherein the first doped region is electrically connected to a first voltage; and
  a second doped region of the second conductivity type located in the well region, wherein the second doped region is electrically connected to a second voltage; and
at least two diode series structures parallel to the transient voltage suppressor,
wherein one of the at least two diode series structures is electrically connected to a first input/output terminal, and the other of the at least two diode series structures is electrically connected to a second input/output terminal.

* * * * *